United States Patent [19]
Takizawa

[11] Patent Number: 5,956,570
[45] Date of Patent: Sep. 21, 1999

[54] METHOD OF MANUFACTURING SEMICONDUCTOR SUBSTRATE AND METHOD OF MANUFACTURING SOLID STATE IMAGING DEVICE

[75] Inventor: Ritsuo Takizawa, Tokyo, Japan

[73] Assignee: Sony Corporation, Tokyo, Japan

[21] Appl. No.: 08/862,394

[22] Filed: May 23, 1997

[30] Foreign Application Priority Data

May 27, 1996 [JP] Japan .................................. 8-132431

[51] Int. Cl.⁶ .................................................. H01L 21/00
[52] U.S. Cl. .................................. 438/60; 438/57; 438/75
[58] Field of Search ................................ 438/60, 57, 61, 438/65, 67, 75, 506

[56] References Cited

U.S. PATENT DOCUMENTS 5,261,960  11/1993  Ozias ........................................ 118/19
5,405,803   4/1995  Kusaka ...................................... 438/75

*Primary Examiner*—Chandra Chaudhari
*Assistant Examiner*—Craig Thompson
*Attorney, Agent, or Firm*—Hill & Simpson

[57] ABSTRACT

A method of manufacturing a semiconductor substrate includes according to the present invention a step of growing, when an epitaxial semiconductor substrate used for a solid-state imaging device is manufactured, an epitaxial layer on a substrate by using $SiHCl_3$ as a source gas without HCl etching being effected on a substrate surface immediately before the epitaxial growth. A method of manufacturing a solid-state imaging device according to the present invention includes a step of growing an epitaxial layer on the substrate by using $SiHCl_3$ as a source gas without HCl etching being effected on a substrate surface immediately before the epitaxial growth, and a step of forming a solid-state imaging element on the epitaxial layer of the epitaxial semiconductor substrate.

8 Claims, 6 Drawing Sheets

METHOD OF MANUFACTURING SEMICONDUCTOR SUBSTRATE AND METHOD OF MANUFACTURING SOLID STATE IMAGING DEVICE

BACKGROUND OF THE INVENTION

1. Field of the Invention

The present invention relates to a method of manufacturing a semiconductor substrate used for a solid-state imaging device.

The present invention also relates to a method of manufacturing a solid-state imaging device using the semiconductor substrate manufactured by the above method.

2. Description of the Related Art

In general, a Czochralski (CZ) substrate grown by a Czochralski (CZ) method, a magnetic field applied czochralski (MCZ) substrate grown by a magnetic field applied Czochralski (MCZ) method, and an epitaxial semiconductor substrate obtained by forming an epitaxial layer on the CZ substrate or the MCZ substrate are frequently used as a semiconductor substrate used to form a semiconductor device such as a solid-state imaging device or the like.

Especially, the epitaxial semiconductor substrate and the MCZ substrate are mainly employed as substrates for the solid-state imaging devices in order to reduce unevenness of the image contrast resulting from unevenness of a dopant concentration (striation). Since in the epitaxial semiconductor substrate of the epitaxial semiconductor substrate and the MCZ substrate a low-resistance region (e.g., a buried region or a low-resistance substrate) can be formed below a device forming layer, the epitaxial semiconductor substrate is effective in low power drive and lower consumed power and hence the fields of its application are expected to be wider.

When a silicon epitaxial semiconductor substrate is manufactured, a chemical vapor deposition (CVD) method is employed as a practical method and the following four main source gasses are employed.

Two kinds of source gasses, i.e., $SiCl_4$ [$SiCl_4+2H_2 \rightarrow Si+4HCl$] and $SiHCl_3$ [$SiHCl_3+H_2 \rightarrow Si+3HCl$] are employed in a hydrogen reduction method.

Two kinds of source gasses, i.e., $SiH_2Cl_2$ [$SiH_2Cl_2 \rightarrow Si+2HCl$] and $SiH_4$ [$SiH_4 \rightarrow Si+2H_2$] are employed in a thermal cracking process.

Of the above four source gasses, the source gas of $SiHCl_3$ is inexpensive and fast in growth speed and hence is suitable for use in the growth of a thick-film epitaxial layer. Therefore, the source gas of $SiHCl_3$ is employed to form an epitaxial layer for manufacturing the solid-state imaging device.

However, the epitaxial layer formed by using the source gas of $SiHCl_3$ has many metal impurities (especially heavy metal impurities) mixed therein during the epitaxial growth thereof and hence it is impossible to sufficiently reduce a white-point defect causing a dark current of the solid-state imaging device, which is a bar to obtain satisfactory characteristics and satisfactory yield.

A source for generating the heavy metal impurity can be considered to be an SUS system member in a belljar of an epitaxial growth apparatus, a source gas pipe or the like. If a source gas contains a material of the chlorine (Cl) system, then it can be considered that the HCl is produced upon the epitaxial growth because of decomposition of the material and then corrodes the SUS system member and hence the corroded material is contained as chloride in the source gas and further mixed into the epitaxial layer.

SUMMARY OF THE INVENTION

In view of such aspects, it is therefore an object of the present invention to provide a method of manufacturing a semiconductor substrate, i.e., a so-called epitaxial semiconductor substrate which helps an epitaxial layer to have less metal impurity mixed thereinto.

It is another object of the present invention to provide a method of manufacturing a solid-state imaging device in which a white-point defect is reduced.

According to a first aspect of the present invention, a method of manufacturing a semiconductor substrate includes a step of growing, when an epitaxial semiconductor substrate used for solid-state imaging device is manufactured, an epitaxial layer on the substrate by using $SiHCl_3$ as a source gas without a HCl etching being effected on a substrate surface immediately before the epitaxial growth.

According to a second aspect of the present invention, a method of manufacturing a solid-state imaging device includes a step of growing an epitaxial layer on a substrate by using $SiHCl_3$ as a source gas without the HCl etching being effected on a substrate surface immediately before the epitaxial growth, and a step of forming a solid-state imaging element in the epitaxial layer of the epitaxial semiconductor substrate.

DESCRIPTION OF THE PREFERRED EMBODIMENT

A method of manufacturing a semiconductor substrate and a method of manufacturing a solid-state imaging device according to an embodiment of the present invention will hereinafter be described with reference to the accompanying drawings.

Figure 1:
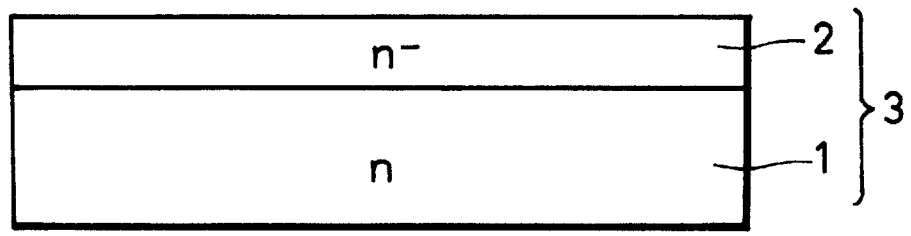
FIG. 1 is a cross-sectional view showing an example of an epitaxial semiconductor substrate according to the present invention.

Respective source gasses of $SiCl_4$, $SiHCl_3$, $SiH_2Cl_2$, and $SiH_4$ were used to manufacture an epitaxial semiconductor substrates 3 shown in FIG. 1 in each of which an n-type (phosphorus-doped) silicon epitaxial layer 2 having a thickness of 12 μm and a specific resistance of 40 to 50 Ωcm was formed by epitaxial growth on a CZ silicon substrate (phosphorus-doped n-type substrate having a specific resistance of 8 to 12 Ωcm) 1 having a diameter of 4 inches. In this case, in order to compare inherent qualities of the epitaxial layers 2 of the manufactured epitaxial semiconductor substrates 3, each of the epitaxial semiconductor substrates 3 was not subjected to gettering.

Figure 2:
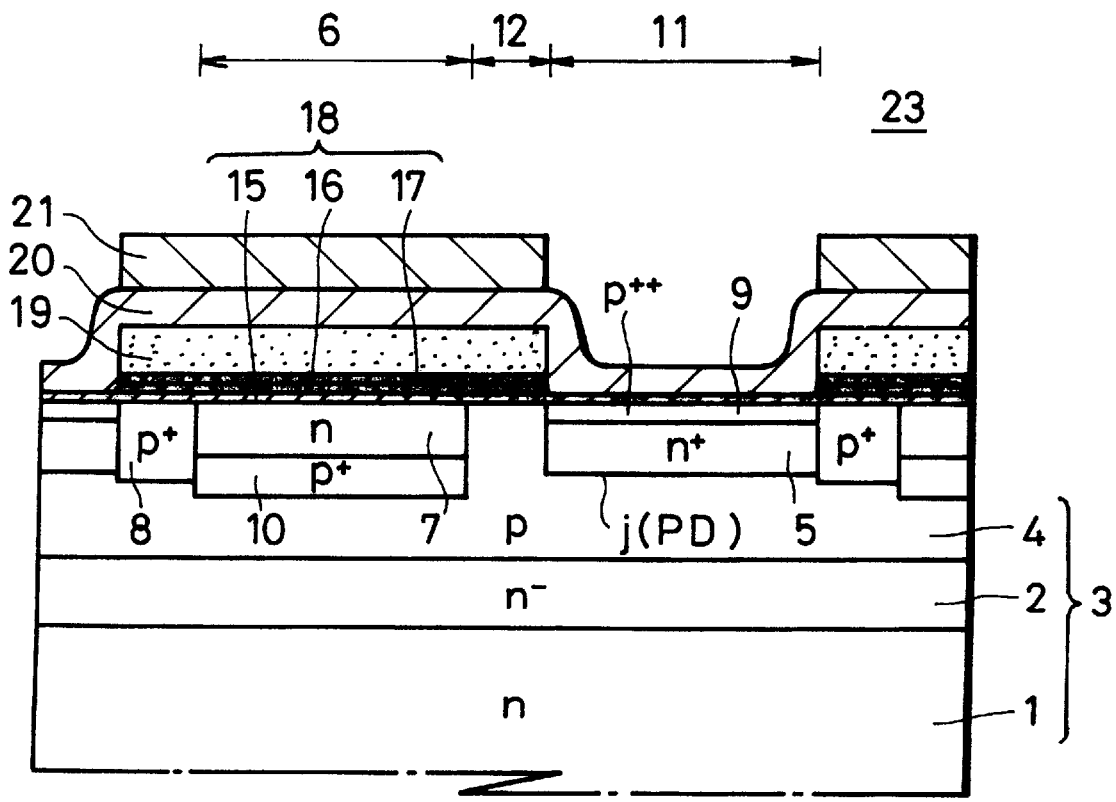
FIG. 2 is a diagram showing an arrangement of a solid-state imaging device according to the present invention.

A charge coupled device (CCD) solid-state imaging device was formed on each of the epitaxial semiconductor substrates manufactured under the different epitaxial growth conditions using the above four kinds of source gases, so that solid-state imaging devices 23 shown in FIG. 2 was manufactured.

The solid-state imaging device 23 has a p-type well region 4 formed on the n-type epitaxial layer 2 of the above epitaxial semiconductor substrate 3. In the p-type well region 4, an n-type impurity diffusion region 5, an n-type transfer channel region 7 forming a vertical transfer register 6 and a p-type channel stopper region 8 are formed. A p-type region 9 is formed on the n-type impurity diffusion region 5, and a second p-type well region 10 is formed immediately under the n-type transfer channel region 7.

A light receiving portion (photoelectric converting portion) 11 is formed of a photodiode PD produced by a pn junction j of the n-type impurity diffusion region 5 and the p-type well region 4. The light receiving portion 11 serves as a pixel, and a plurality of light receiving portions 11 are arranged in a matrix fashion.

A plurality of transfer electrodes 19 formed of first and second polycrystal silicons are formed through a gate insulating film 18 formed of, for example, a $SiO_2$ film 15, a $Si_3N_4$ film 16 and a $SiO_2$ film 17 on the transfer channel region 7 forming the vertical transfer register 6, the channel stopper region 8 and a reading gate portion 12.

An Al light shielding film 21 is formed on each of the vertical transfer registers 6 through an interlayer insulating layer 20 so as to cover each of the vertical transfer registers 6.

Figure 3:
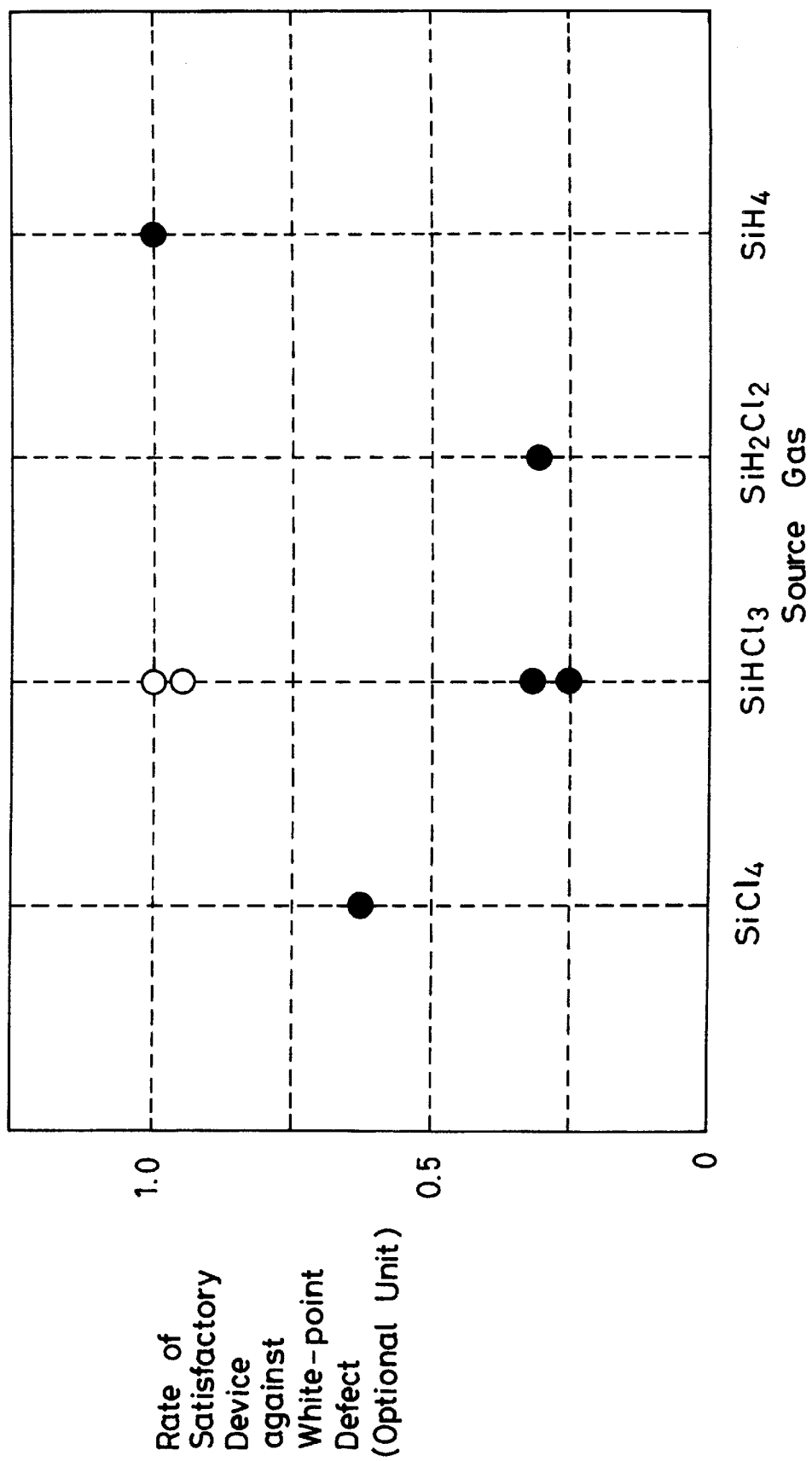
FIG. 3 is a graph used to explain the dependence of a white-point defect on a source gas in the solid-state imaging device according to the present invention.

FIG. 3 is a graph showing correlation between a source gas ($SiCl_4$, $SiHCl_3$, $SiH_2Cl_2$, $SiH_4$) and a rate of a satisfactory CCD solid-state imaging device against a white-point defect.

Solid circles shown in FIG. 3 represent the correlations of CCD solid-state imaging devices according to an embodiment disclosed in Japanese patent application No. 7-301449 filed prior to the application of the present invention. In the embodiment of Japanese patent application No. 7-301449, a substrate surface of the substrate was etched by using HCl immediately before the epitaxial growth (the surface was removed by about 0.3 $\mu$m).

The HCl etching is a high-temperature etching employed for improving crystallinity of the epitaxial layer and carried out in an epitaxial growth apparatus by removing a natural oxide film, an organic material, dust etc. on a substrate surface as well as a silicon of the substrate. This HCl etching is a high temperature etching and usually carried out.

Study of the solid circles shown in FIG. 3 reveals that a white-point defect of the solid-state imaging device using the epitaxial substrate formed with the source gas of $SiH_4$ is satisfactory as compared of those of the solid-state imaging devices employing the epitaxial substrates formed with the source gasses $SiCl_4$, $SiHCl_3$, $SiH_2Cl_2$. The reason for this result was considered as that since used of the source gas of $SiH_4$ was prevented from producing HCl gas having high corrosion, less metal impurity was mixed into the epitaxial layer.

However, the succeeding research reveals that an amount of the metal impurity mixed into an epitaxial layer by the HCl etching is not so small. The research also reveals that, as shown by open circles in FIG. 3, if the HCl etching for a substrate surface immediately before the epitaxial growth is not carried out, then the rate of the satisfactory solid-state imaging devices employing the epitaxial substrates formed by using the source gas of $SiHCl_3$ can also be improved to an extent similarly to that of the satisfactory solid-state imaging devices employing the epitaxial substrates formed by using the source gas of $SiH_4$.

The succeeding research also reveals that omission of the HCl etching has no influence on deterioration of crystallinity of the epitaxial layer when optimum washing operation is carried out before the epitaxial growth. If a satisfactory epitaxial layer can be formed by using $SiHCl_3$ gas, then it becomes possible to produce the epitaxial substrate with an inexpensive cost and for a short period of time as compared with the embodiment of $SiH_4$ gas.

Figure 4:
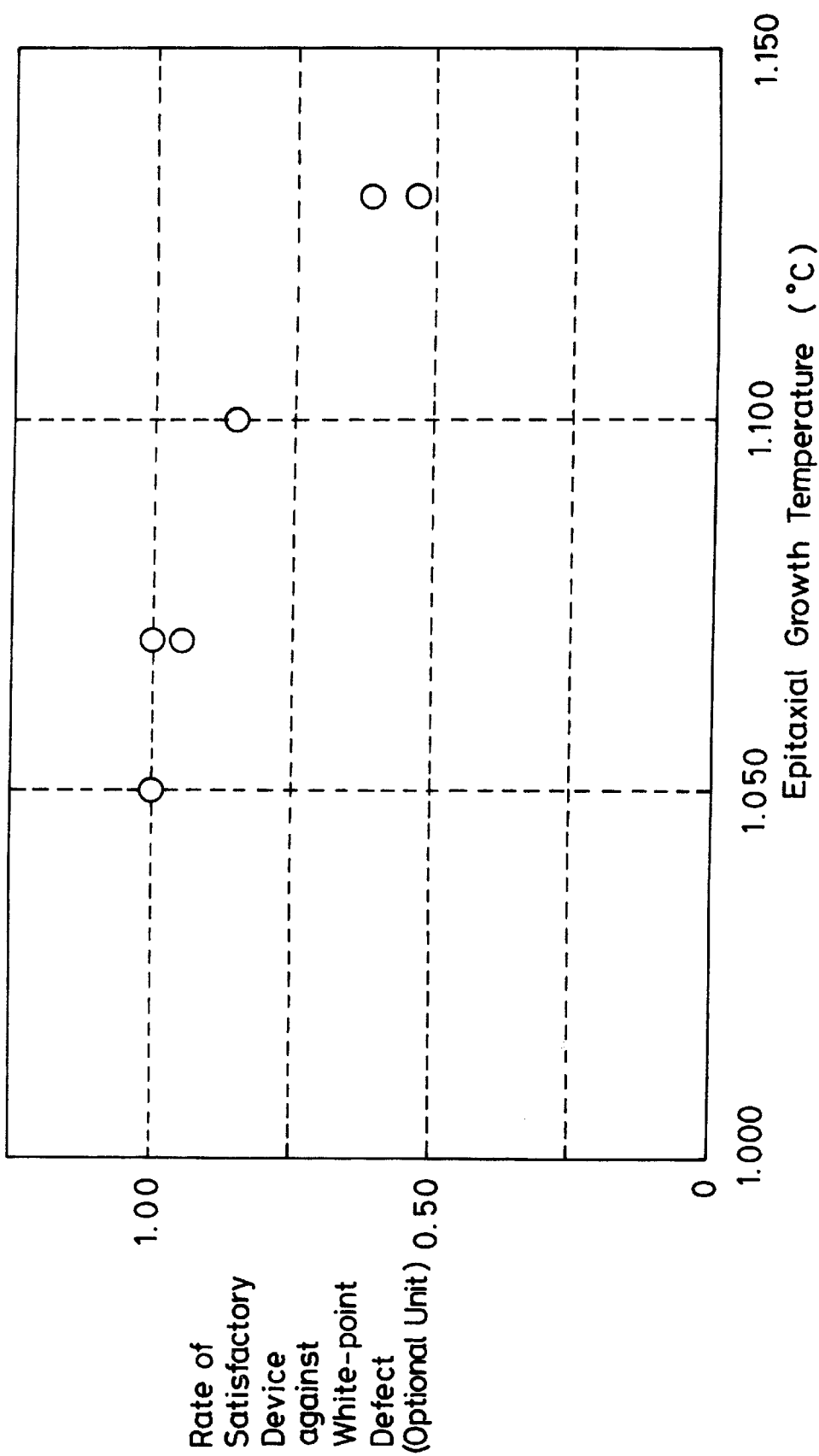
FIG. 4 is a graph used to explain the dependence of the white-point defect on an epitaxial growth temperature in the solid-state imaging device according to the present invention.

FIG. 4 is a graph showing estimation results of a rate of a satisfactory CCD solid-state imaging device against a white-point defect obtained when the epitaxial layers 2 each having the same arrangement as that described above were formed by using $SiHCl_3$ gas at different epitaxial growth temperatures.

It is frequently observed that the epitaxial layer is formed by using the $SiHCl_3$ gas at around 1130° C. It has not been clear how much influence on a quality of the epitaxial layer the epitaxial growth temperature has. Study of FIG. 4 reveals that on a low temperature side the rate of the satisfactory CCD solid-state imaging device against a white-point defect is satisfactory.

Therefore, according to the present invention, if the epitaxial growth temperature is set smaller than 1130° C. and preferably equal to or smaller than 1100° C. and more preferably equal to or smaller than 1070° C., then it is possible to improve the rate of the satisfactory CCD solid-state imaging device against a white-point defect about twice as compared with a CCD solid-state imaging device to which the present invention is not applied.

The reason for reduction of the white-point defect at a low temperature is considered to be that the metal impurity of the belljar forming portion of the epitaxial growth apparatus and the metal impurity mixed through a susceptor in the epitaxial layer are more suppressed as a temperature is lowered.

FIGS. 5A to 5C, 6D, 6E, 7F and 7G are diagrams showing a method of manufacturing a solid-state imaging device according to the present invention, by way of example. In this embodiment, the present invention is applied to a CCD solid-state imaging device similar to that shown in FIG. 2.

Figure 5A:
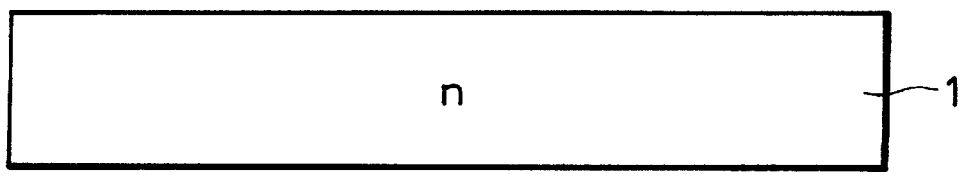
FIGS. 5A to 5C are diagrams showing processes of manufacturing the solid-state imaging device according to the present invention.

As shown in FIG. 5A, an n-type CZ silicon substrate 1 is prepared. The silicon substrate 1 has a main plane of (100) plane, a specific resistance of 10 Ωcm and a diameter of 4 inches.

Figure 5B:
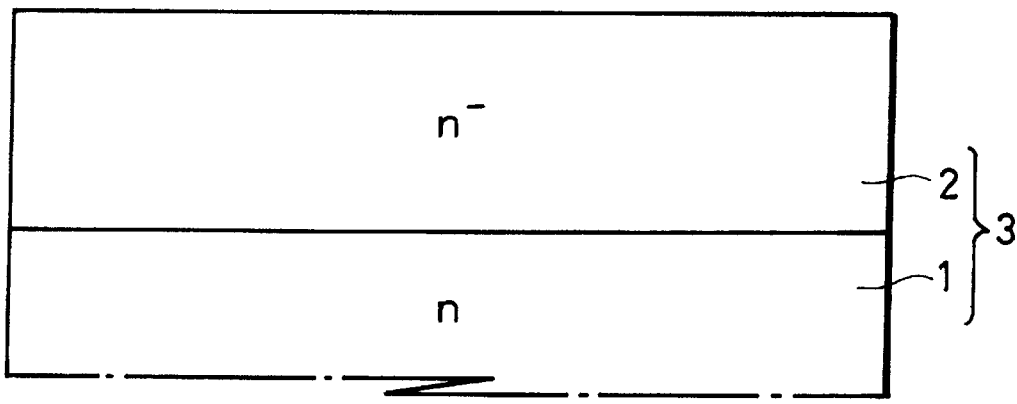

As shown in FIG. 5B, without the HCl etching being effected on a substrate surface immediately before the epitaxial growth, an n-type silicon epitaxial layer 2 with its thickness of about 12 $\mu$m is formed on one main plane of the substrate 1 by epitaxial growth employing a thermal cracking process using a source gas of $SiHCi_3$ at an epitaxial growth temperature of 1070° C., so that an n-type silicon epitaxial substrate 3 is formed. $PH_3$ is employed as a doping gas which is an n-type impurity. A specific resistance of the silicon epitaxial layer 2 ranges from 40 to 50 Ωcm.

Figure 5C:
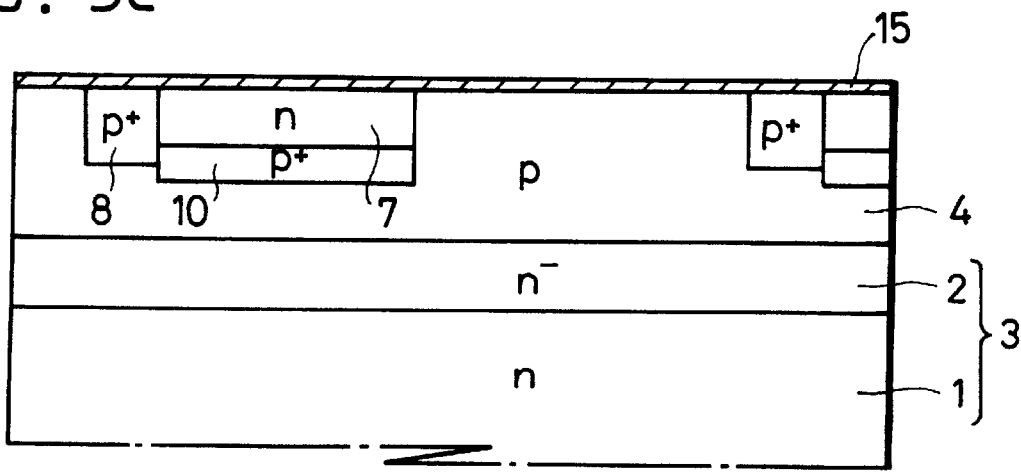

As shown in FIG. 5C, a first p-type well region 4 is formed on the n-type silicon epitaxial layer 2. An insulating film, e.g., a $SiO_2$ film 15 is formed on a surface of the p-type well region 4. Then, an n-type impurity and a p-type impurity are selectively ion-implanted in the first p-type well region 4, so that an n-type transfer channel region 7 forming a vertical transfer register, a p-type channel stopper region 8 and a second p-type well region 10 are formed.

Figure 6D:
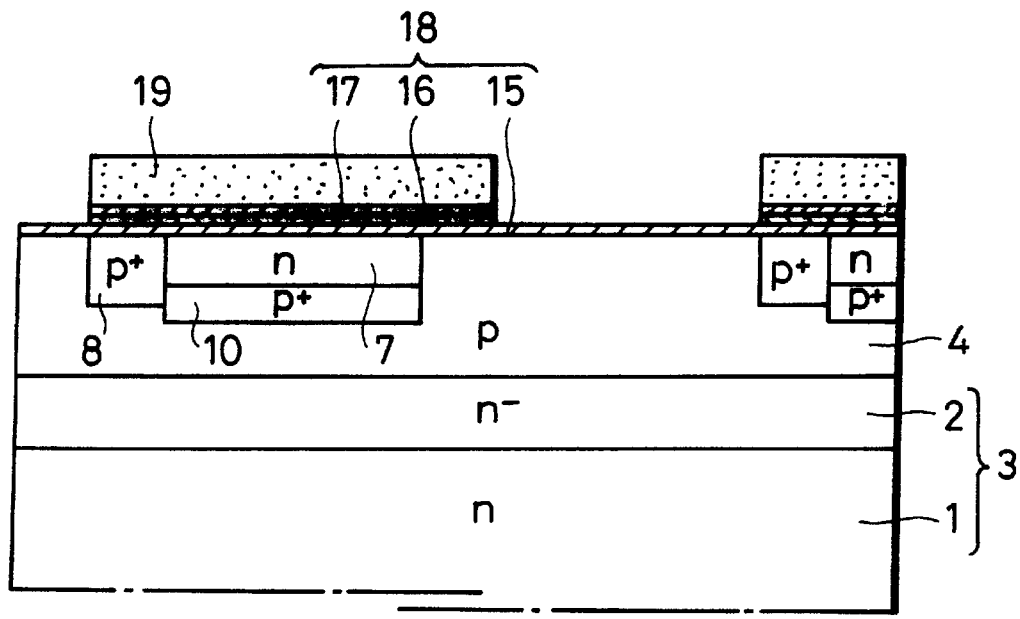
FIGS. 6D and 6E are diagrams showing process steps for manufacturing the solid-state imaging device according to the present invention.

As shown in FIG. 6D, a $Si_3N_4$ film 16 and a $SiO_2$ film 17, for example, are successively laminated on the entire surface of the $SiO_2$ film 15. Thereafter, the $Si_3N_4$ film 16 and the $SiO_2$ film 17 at a portion corresponding to a light receiving portion 11 shown in FIG. 7G are selectively etched away. A laminated film left after the etching, i.e., a laminated film formed of the $SiO_2$ film 15, the $Si_3N_4$ film 16 and the $SiO_2$ film 17 on a portion corresponding to the n-type transfer channel region 7, the channel stopper region 8 and a reading gate portion 12 shown in FIG. 7G is formed as a gate insulating film 18. Thereafter, a transfer electrode 19 formed of a polycrystal silicon layer is formed on the gate insulating layer 18.

Figure 6E:
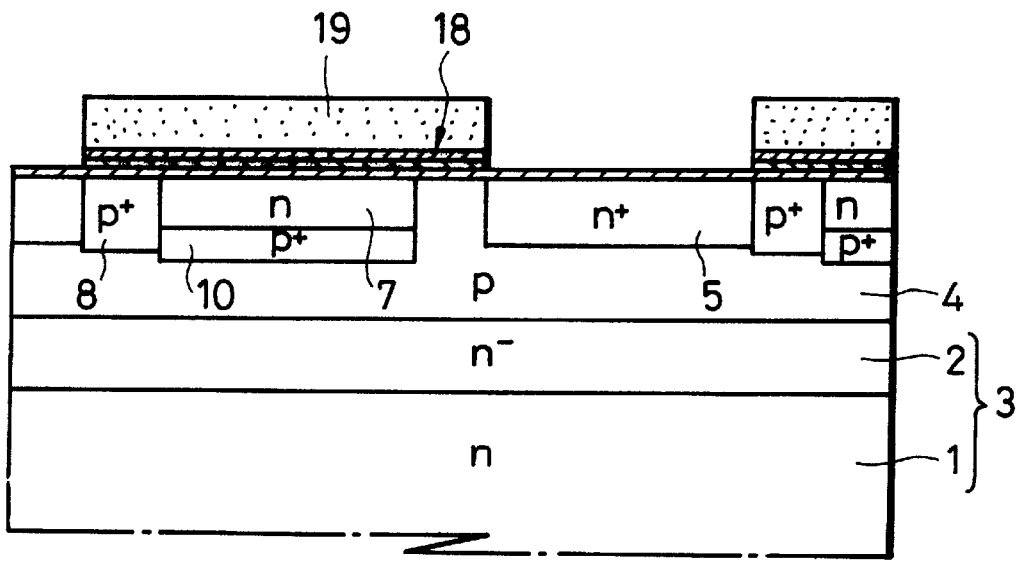

As shown in FIG. 6E, by employing the transfer electrode 19 as a mask, the n-type impurity, e.g., phosphorus (P) is selectively ion-implanted in the first p-type well region 4 and particularly in a portion thereof in depth by about 0.4 $\mu$m from the substrate 3 surface, and then the ion-implanted portion of the first p-type well region 4 is subjected to $N_2$ annealing. Thus, an n-type impurity diffusion region 5 is formed. At this time, the light receiving portion 11 is formed of a photodiode PD formed of a pn junction formed by the n-type impurity diffusion region 5 and the first p-type well region 4.

Figure 7F:
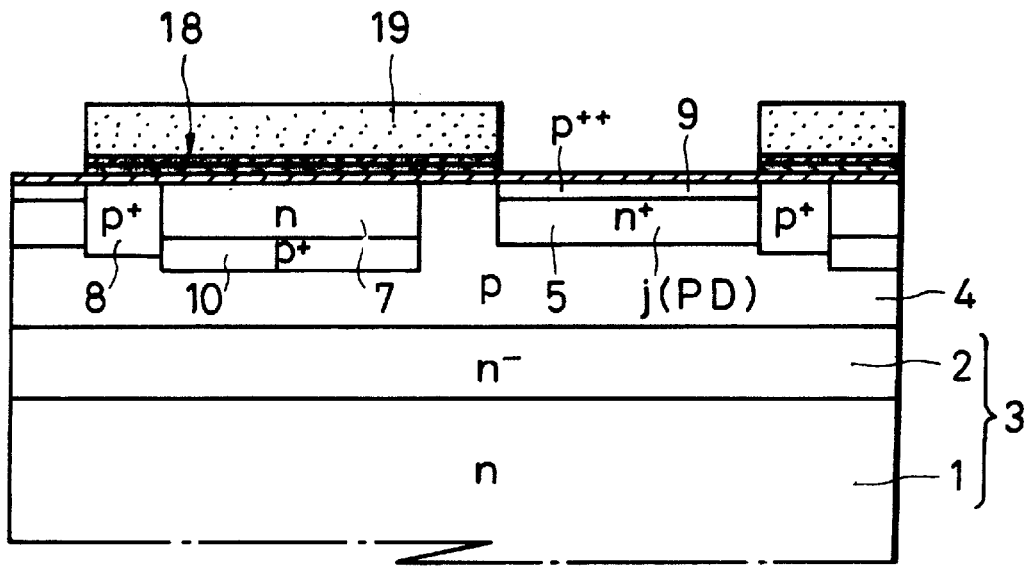
FIGS. 7F and 7G are diagrams showing process steps of manufacturing the solid-state imaging device according to the present invention.
Figure 7G:
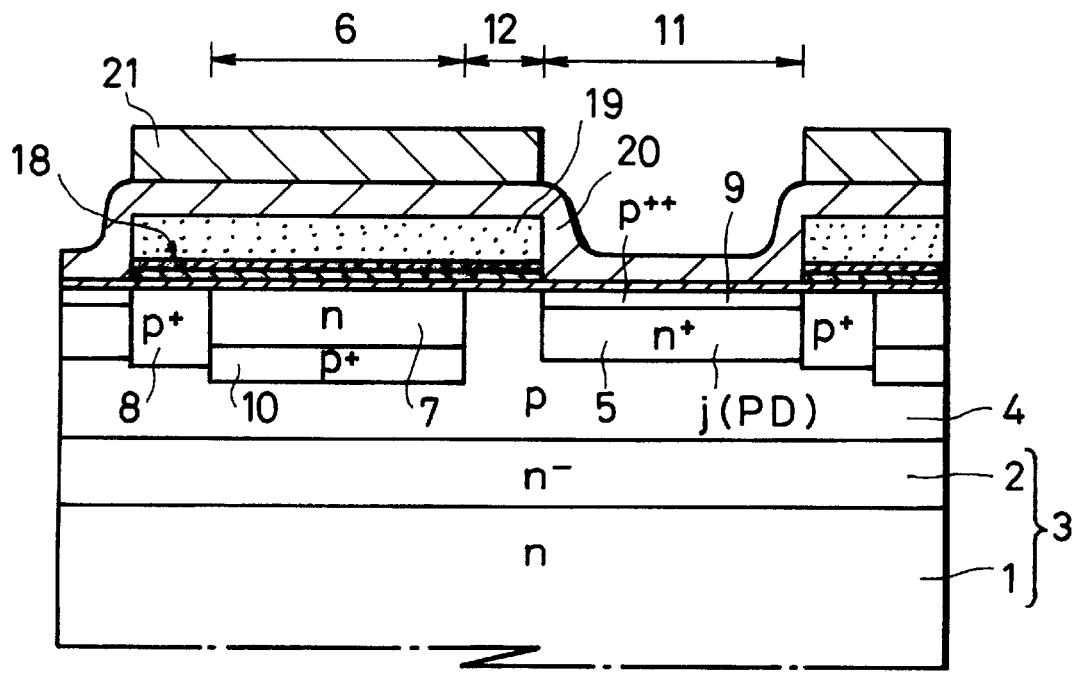

As shown in FIG. 7F, by employing the transfer electrode 19 as a mask, the p-type impurity, e.g., boron (B) is selectively ion-implanted in a surface of the light receiving portion 11 and heat treatment is carried out in $N_2$, thereby the ion-implanted p-type impurity being diffused and activated. Thus, a p-type positive charge storage region 9 is formed on a surface of the light receiving portion 11.

As shown in FIG. 7G, an interlayer insulating layer 20 formed of a phosphorus silicate glass (PSG) or the like is coated on the entire surface including the transfer electrode 19. Then, an Al light shielding film 21 is selectively formed thereon through the interlayer insulating layer 20. Thus, a desired CCD solid-state imaging device 23 is obtained.

According to the above embodiment, without the HCl etching being effected on the substrate surface immediately before the epitaxial growth, the epitaxial layer 2 is formed on the silicon substrate 1 by epitaxial growth by employing $SiHCl_3$ as a source gas at the epitaxial growth temperature which is smaller than 1130° C., preferably 1100° C. or smaller, and more preferably 1070° C. or smaller. Therefore, it is possible to produce the silicon epitaxial substrate 3 having a little metal impurity mixed therein with an inexpensive cost and for a short period of time. If the solid-state imaging element is formed on the epitaxial layer 2 by using the obtained silicon epitaxial substrate 3 having a little metal impurity mixed therein, then it is possible to produce the solid-state imaging device in which the number of white-point defects is drastically reduced.

While the gettering method is not employed in this embodiment, it is confirmed that combination of the method according to the present invention with various gettering methods (such as intrinsic gettering, polycrystal gettering, phosphorus gettering, carbon implantation gettering or the like) can further reduce the number of white-point defects.

While in the above embodiment the n-type impurity diffusion region 5 is formed on the surface of the p-type well region 4 formed in the n-type silicon epitaxial substrate 3 and then the photodiode PD is formed by the pn junction of the p-type well region 4 and the n-type impurity diffusion region 5 to thereby form the solid-state imaging device, the present invention is not limited thereto and can be applied to fabrication of the photodiode PD obtained by forming the n-type impurity diffusion region 5 in a p-type silicon epitaxial substrate.

While the present invention is applied to the CCD solid-state imaging device in this embodiment, the present invention can also be applied to fabrication of other solid-state imaging devices, e.g., an amplification type solid-state imaging device and so on.

While in the above embodiment the present invention is applied to the epitaxial semiconductor substrate obtained by forming the n-type epitaxial layer 2 on the n-type semiconductor substrate 1, it is needless to say that the present invention is not limited thereto and can be applied to an epitaxial semiconductor substrate obtained by forming a p-type epitaxial layer on a p-type semiconductor substrate. Moreover, the present invention can be applied an epitaxial semiconductor substrate obtained by forming a second conductivity type epitaxial layer on a first conductivity type semiconductor substrate.

According to the method of manufacturing the semiconductor substrate according to the present invention, the epitaxial layer is formed by epitaxial growth on the semiconductor substrate by employing $SiHCl_3$ as the source gas without the HCL etching being effected on the substrate surface immediately before the epitaxial growth and especially the epitaxial growth temperature is set smaller than 1130° C. Therefore, it is possible to manufacture the semiconductor substrate having a little metal impurity mixed in the epitaxial layer.

According to the method of manufacturing the solid-state imaging device according to the present invention, since the above epitaxial semiconductor substrate having a little metal impurity mixed therein is employed, it is possible to drastically reduce the white-point defects of the solid-state imaging device.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A method of manufacturing a solid-state imaging device, comprising the steps of:

providing a silicon substrate surface;

growing an epitaxial layer on the substrate surface by using $SiHCl_3$ as a source gas without HCl etching being effected on the substrate surface immediately before the epitaxial growth to thereby manufacture an epitaxial semiconductor substrate; and formin a solid-state imaging element on said epitaxial layer of said epitaxial semiconductor substrate.

2. A method of manufacturing a solid-state imaging device according to claim 1, wherein the growth of said epitaxial layer of said epitaxial semiconductor substrate is carried out at an epitaxial growth temperature smaller than 1130° C.

3. A method manufacturing a semiconductor comprising the steps of:

providing a silicon substrate having a substrate surface free from HCl etching, and then growing an epitaxial layer on the substrate surface by using $SiHCl_3$ as a source gas to form an epitaxial semiconductor substrate for a solid-state imaging device.

4. A method according to claim 3, wherein the epitaxial growth is at a temperature $\leq 1100°$ C.

5. A method according to claim 3, wherein the growth is at a temperature $\leq 1070°$ C.

6. A method according to claim 1, wherein the epitaxial growth is at a temperature $\leq 1100°$ C.

7. A method according to claim 1, wherein the temperature of the epitaxial growth is $\leq 1070°$ C.

8. A method of manufacturing a semiconductor substrate according to claim 3, wherein the growth of said epitaxial layer is carried out at an epitaxial growth temperature smaller than 1130° C.

* * * * *